United States Patent [19]
Levinson et al.

[11] Patent Number: 5,985,498
[45] Date of Patent: Nov. 16, 1999

[54] METHOD OF CHARACTERIZING LINEWIDTH ERRORS IN A SCANNING LITHOGRAPHY SYSTEM

[75] Inventors: Harry Levinson, Saratoga; Khanh B. Nguyen, San Mateo; Anna M. Minvielle, San Jose, all of Calif.

[73] Assignee: Advanced Micro Devices, Inc., Sunnyvale, Calif.

[21] Appl. No.: 09/259,928

[22] Filed: Mar. 1, 1999

[51] Int. Cl.$^6$ .................................................. G03F 9/00
[52] U.S. Cl. ....................................................... 430/30
[58] Field of Search ..................................... 430/30

[56] References Cited

U.S. PATENT DOCUMENTS

| | | |
|---|---|---|
| 4,047,795 | 9/1977 | Hughes et al. . |
| 4,672,457 | 6/1987 | Hyatt . |
| 4,677,301 | 6/1987 | Tanimoto et al. . |
| 4,769,696 | 9/1988 | Utsuda et al. . |
| 4,908,656 | 3/1990 | Suwa et al. . |
| 5,260,151 | 11/1993 | Berger et al. ................................ 430/5 |
| 5,383,018 | 1/1995 | Sadjadi ..................................... 356/243 |
| 5,408,083 | 4/1995 | Hirukawa et al. .................... 250/201.2 |
| 5,512,397 | 4/1996 | Leedy ......................................... 430/30 |
| 5,602,619 | 2/1997 | Sogard ....................................... 355/53 |
| 5,691,541 | 11/1997 | Ceglio et al. .......................... 250/492.1 |
| 5,706,091 | 1/1998 | Shiraishi .................................. 356/399 |
| 5,717,612 | 2/1998 | Capodieci ................................ 364/578 |
| 5,766,806 | 6/1998 | Spence ......................................... 430/5 |
| 5,790,239 | 8/1998 | Komatsuda et al. ...................... 355/67 |
| 5,798,528 | 8/1998 | Butsch et al. ......................... 250/492.2 |

*Primary Examiner*—Christopher G. Young

[57] ABSTRACT

A method of characterizing linewidth errors in a lithography system 30 used to delineate a desired pattern onto an exposure site of a wafer 32. The pattern of a reticle 34 is transferred onto an exposure site 56 of a wafer 32 by projecting a slit of light extending in a slit direction y through the reticle while scanning the reticle and the wafer in a scanning direction x relative to the lens. The exposure site 56 is conceptually divided into a grid having one series of lines extending in the scan direction x and another series of lines extending in the slit direction y whereby points corresponding to perpendicular intersections of the lines may each be assigned a pair of coordinates (x,y). The linewidths of the pattern are measured for each of the points (x,y) and a linewidth error value ERROR (x,y) is generated for each of the points (x,y). An $ERROR_{optical}(y)$ value for each y coordinate is calculated by averaging the ERROR (x,y) values for each group of points (x,y) having a common y coordinate. In this manner, the contribution of optical aberrations to linewidth errors may be determined.

20 Claims, 3 Drawing Sheets

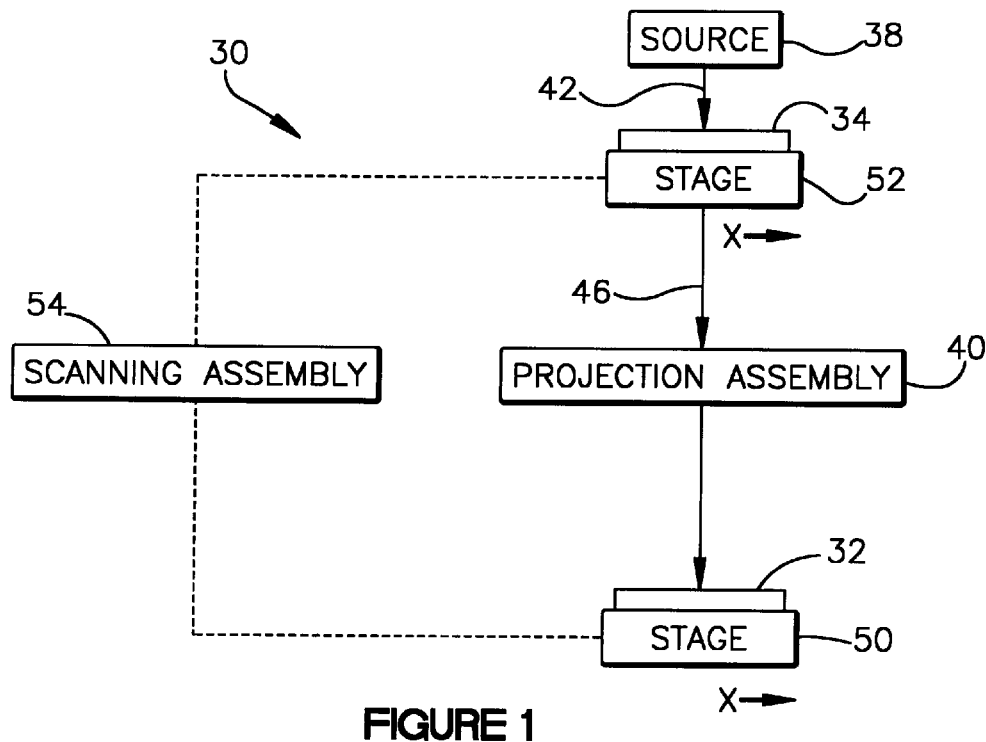
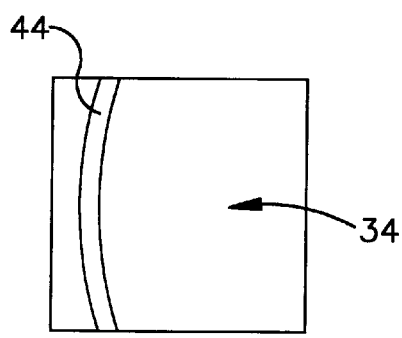
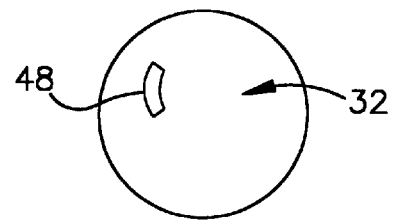
FIGURE 1
FIGURE 2
FIGURE 3

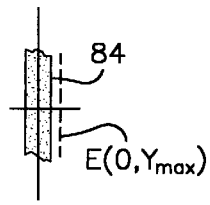
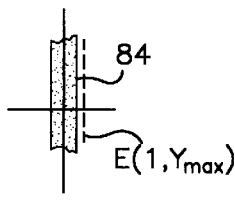
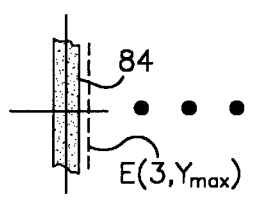
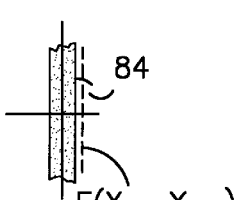
FIGURE 7M    FIGURE 7N    FIGURE 7O    FIGURE 7P
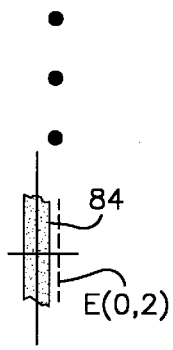
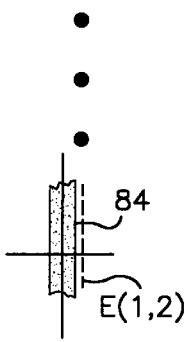
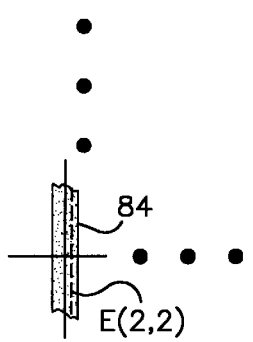
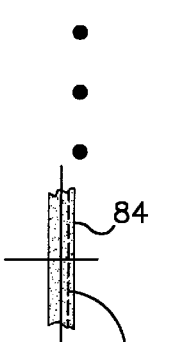
FIGURE 7I    FIGURE 7J    FIGURE 7K    FIGURE 7L
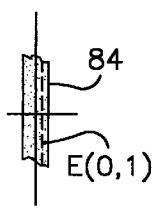
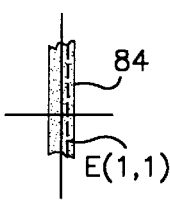
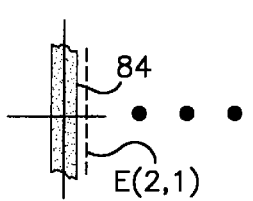
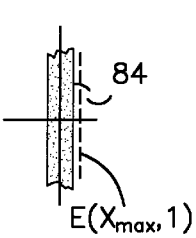
FIGURE 7E    FIGURE 7F    FIGURE 7G    FIGURE 7H
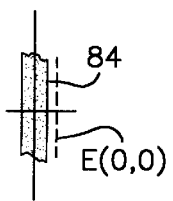
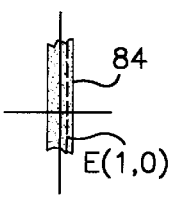
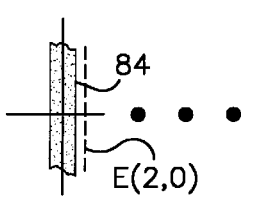
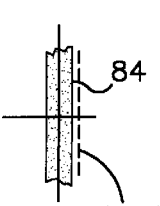
FIGURE 7A    FIGURE 7B    FIGURE 7C    FIGURE 7D

METHOD OF CHARACTERIZING LINEWIDTH ERRORS IN A SCANNING LITHOGRAPHY SYSTEM

FIELD OF THE INVENTION

This invention relates to a method of characterizing linewidth errors in a scanning lithography system.

BACKGROUND OF THE INVENTION

Integrated circuit fabrication techniques vary greatly depending on the specific chip structure being made, the exact processes being used, and/or the available equipment. However, almost all fabrication methods include a lithography process during which certain portions of a wafer (i.e., a silicon slice coated with a photoresist material) are exposed to radiation to delineate a latent image corresponding to the desired circuit pattern. Specifically, radiation is passed through a reticle having clear portions and opaque portions corresponding to the desired pattern and the radiation passing through the reticle's clear portions passes to the wafer. If reduction optics are employed, the imaging portions of the reticle reflect an enlarged version of the desired pattern, such as four times (4×) the desired pattern, onto an exposure site on the wafer.

A lithography process may be performed by one of several available lithography systems. Of particular relevance to the present invention is a scanning lithography system, such as a step-and-scan lithography system. A scanning lithography system typically includes an illumination source and a projection assembly. The illumination source provides a narrow slit of light corresponding to that section of the light beam having minimal aberrations. In a reflective scanning system, the slit of light is in the form of a narrow ring concentric with the optical axis of the system's reflecting mirrors. In a purely refractive scanning system, the slit of light is the form a linear band. In a catadioptric scanning system, the slit of light may be in the form of either a ring or a band.

The slit of light illuminates a certain slit-shaped region of the reticle. Radiation passing through the clear portions of the reticle are projected by the projection assembly onto the wafer to delineate a slit-shaped region of the wafer. If reduction optics are employed, the projection assembly includes a reduction lens and the slit-shaped region of the wafer is a demagnified version of the reticle region. For example, if the projection assembly introduces a 4:1 demagnification factor, the reticle region will be four times larger than the wafer region.

The illumination slit extends entirely across the imaging surface of the reticle in one direction and is scanned across the imaging surface of the wafer in a transverse direction. For the purposes of the present discussion, the direction the slit extends will be called the "slit direction" and the direction of scanning will be called the "scan direction."

Scanning is accomplished by relative movement between the optical elements (i.e., the illumination source and the projection assembly) and the imaging elements (i.e., the wafer and the reticle). For example, the illumination source and the projection assembly may remain stationary and the wafer and the reticle may be moved relative thereto. To this end, the lithography system could include stages that support the wafer and the reticle, respectively, and a scanning assembly which moves the stages in the scan direction. If the system employs reduction optics, the wafer must move at a slower rate than the reticle. Thus, if the projection assembly introduces a 4:1 demagnification factor, the scanning assembly must move the reticle stage four times faster than the wafer stage.

A lithography system must have the consistent ability to print features having a certain minimum size. This feature size is measured in terms of "linewidth." Typically, during the set-up of the lithography system, an actual linewidth is measured and compared to a target value to obtain an error factor. If the error factor is within an acceptable tolerance, the lithography process may proceed. If the error factor is too great, adjustments are made to the lithography components to obtain acceptable linewidth tolerances before proceeding with the lithography process.

In a reduction scanning lithography system, linewidth errors may be caused by optical aberrations and/or other non-optical factors. As such, the absolute value of a linewidth error itself does not provide any insight as to whether the errors are caused by the system's optical components, its scanning components, or both. While adjustments may be made to, for example, the system's scanning assembly, to reduce linewidth errors to an acceptable tolerance, these adjustments will not cure the contribution of the error caused by optical aberrations.

Accordingly, the inventor appreciated that a need remains for a method of characterizing the contributions to linewidth errors.

SUMMARY OF THE INVENTION

The present invention provides a method of characterizing linewidth errors to determine the contribution of optical aberrations. The invention includes the appreciation that the error contribution of optical aberrations will be the same for all geometries located in the same "slit" position. Accordingly, by separating the linewidth error contribution of the optical aberrations from the other linewidth error contributions, appropriate adjustments may be made to, for example, the scanning assembly.

More particularly, the present invention provides a method of characterizing linewidth errors in a lithography system used to delineate a desired pattern onto an exposure site of a wafer. The method includes the steps of providing a reticle having a pattern and delineating the pattern onto an exposure site of a wafer. This delineation is accomplished by projecting a slit of light through the reticle while using a scanning assembly to move the reticle and the wafer in a scanning direction relative to the lens.

The exposure site is conceptually divided into a grid having a first axis x parallel to the scan direction and a second axis y parallel to the slit direction to thereby define a plurality of points (x,y). The linewidths of the pattern at each point (x,y) is measured and then compared to target linewidth values to generate a linewidth error value ERROR (x,y) for each of the points (x,y).

The reticle may be a test reticle designed so that a portion of its pattern will be substantially centrally positioned within at least a majority of the plurality of points. For example, the pattern may comprises a series of lines extending in either the scan direction or the slit direction. Alternatively, an actual production reticle may be used if the pattern includes features in substantially all of the plurality of points and/or the points are appropriately arranged relative to the pattern.

More particularly, the present invention provides a method of characterizing linewidth errors in a lithography system. The method comprises the steps of providing a reticle having a pattern and delineating the pattern onto an exposure site of a wafer. The delineation is accomplished by projecting a slit of light extending in a slit direction y through the reticle while scanning the reticle and the wafer in a scanning direction x relative to the lens. The exposure site is then conceptually divided into a grid having one series of lines extending in the scan direction x and another series of lines extending in the slit direction y whereby points corresponding to perpendicular intersections of the lines may each be assigned a pair of coordinates (x,y). The linewidths of the pattern are measured for each of the points (x,y) to generate a linewidth error value ERROR (x,y) for each of the points (x,y). An $ERROR_{optical}(y)$ value for each y coordinate is then calculated by averaging the ERROR (x,y) values for each group of points (x,y) having a common y coordinate. In this manner, the contribution of optical aberrations to linewidth errors may be determined.

Preferably, the values ERROR(x,y) values are generated by comparing each of the measured linewidths to a target value to generate a value E(x,y) for each point (x,y), averaging the values E(x,y) to provide an $E_{average}$ value, and then subtracting the $E_{average}$ value from each E(x,y) value to generate the linewidth error values ERROR(x,y).

The method may additionally comprise the steps of generating an $ERROR_{other}(x,y)$ value for each of the points (x,y) that is representative of the contributions to the linewidth errors not caused by optical aberrations. Specifically, the corresponding the $ERROR_{optical}(y)$ value is subtracted from each of the ERROR(x,y) values to generate the $ERROR_{other}$ (x,y) values. The contribution of scanning errors to the linewidth errors may then be determined by calculating an $ERROR_{scan}(x)$ value for each x coordinate. These values are calculated by averaging the $ERROR_{other}(x,y)$ values for each group of points (x,y) having a common x coordinate.

The reticle may be a test reticle designed so that a feature of the pattern will be substantially centrally positioned within at least a majority of the plurality of the points (x,y). For example, the reticle's pattern may comprise a series of lines extending in either the scan direction x or the slit direction y. The lines preferably have a width corresponding to 1 µm or less design features. For example, if 4:1 reduction optics are employed and 1 µm design features are desired, the lines of the reticle's pattern would have a width corresponding to 4 µm.

These and other features of the invention are fully described and particularly pointed out in the claims. The following description and drawings set forth in detail a certain illustrative embodiment of the invention, this being indicative, however, of but one of the various ways in which the principles of the invention may be employed.

DRAWINGS

FIG. 1 is a lithography scanning system according to the present invention, the system being designed to project an illumination slit through a reticle and project a demagnified version of the illumination slit onto a selected exposure site of a wafer while the reticle and the wafer are being moved in a linear scan direction.

FIG. 2 is an enlarged top view of the reticle showing the location on the illumination slit at a certain point in the scanning process.

FIG. 3 is an enlarged top view of the wafer showing the location of the demagnified illumination slit on the exposure site at the same point in the scanning process.

FIGS. 7A–7P are enlarged views of portions of the pattern located at respective points (x,y).

DETAILED DESCRIPTION

Figure 4:
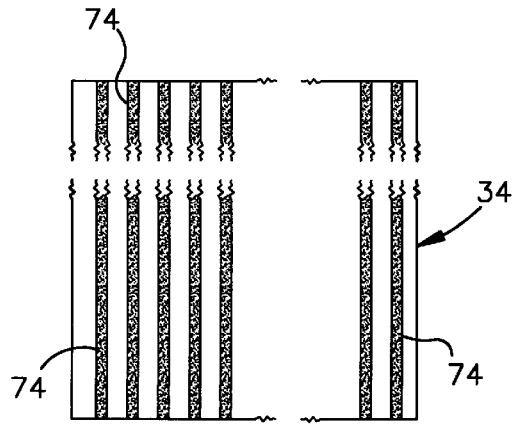
FIG. 4 is an enlarged top view of the reticle showing a design pattern that is projected, in a demagnified form, onto the wafer.

Referring now to the drawings in detail, and initially to FIG. 1, a lithography system 30 according to the present invention is shown. The system 30 is designed to delineate a desired pattern (such as a circuit pattern) onto a wafer 32 by passing light through a reticle 34 having clear portions and opaque portions corresponding to the desired pattern. The illustrated system 30 employs reduction optics whereby the imaging portions of the reticle 34 correspond to an enlarged version of the desired pattern, such as four times (4×) the desired pattern, onto an exposure site of the wafer 32.

The optical components of the lithography system 30 include an illumination source 38 and a projection assembly 40. The illumination source 38 provides a slit 42 of light that illuminates a certain slit-shaped region 44 of the reticle 34. (FIG. 2.) The illustrated system 30 employs reflective optics whereby the region 44 is in the form of an arcuate ring concentric with the system's reflective axis.

Light rays 46 passing through the clear portions of the reticle 34 are projected by the projection assembly 40 onto the wafer 32 to delineate a slit-shaped region 48 of the wafer 32. (FIG. 3.) In the illustrated embodiment employing reduction optics, the projection assembly 40 includes a reduction lens (not specifically shown) and the slit-shaped region 48 is a demagnified version of the reticle region 44. For example, if the projection assembly 40 introduces a 4:1 demagnification factor, the reticle region 44 will be four times larger than the wafer region 48.

As is best shown in FIG. 2, the illuminated region 44 extends entirely across the reticle 32 in one direction which will be called the "slit direction." In order to illuminate the entire surface of the reticle 34, the illumination slit 46 is scanned across the imaging surface of the wafer 32 and the reticle 34 in a certain direction that will be called the "scan direction." In the illustrated embodiment, the scan direction is linear and perpendicular to the slit direction thereby calling to mind a Cartesian coordinate arrangement. As such, the convention may be adopted that the scan direction is the x direction and the slit direction is the y direction.

Scanning is accomplished by relative movement between the optical elements (i.e., the illumination source 38 and the projection assembly 40) and the imaging elements (i.e., the wafer 32 and the reticle 34). In the illustrated embodiment, the illumination source 38 and the projection assembly 40 remain stationary. To this end, the lithography system 30 includes stages 50 and 52 that support the wafer 32 and the reticle 34, respectively, and a scanning assembly 54 which moves the stages 50 and 52 in the scan direction. Since the illustrated system 30 employs reduction optics, the wafer 32 must move at a slower rate than the reticle 34. Thus, if the projection assembly 42 introduces a 4:1 demagnification factor, the scanning assembly 54 must move the reticle stage 52 four times faster than the wafer stage 50.

Figure 5:
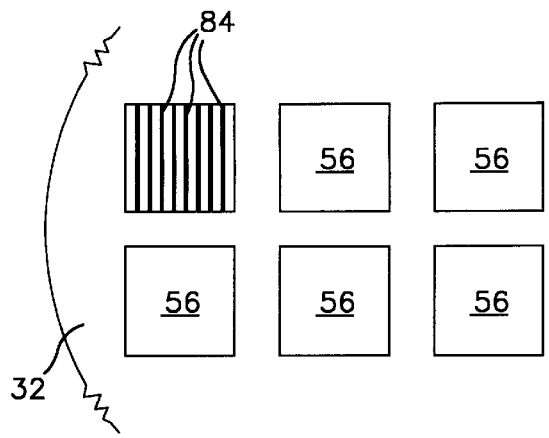
FIG. 5 is an enlarged partial top view of the wafer showing the demagnified design pattern on the selected exposure site.

The illustrated lithography system 30 is a "step-and-scan" system whereby the wafer 32 includes a plurality of exposure sites 56 (FIG. 5). The wafer stage 50 is designed to allow movement of the wafer 32 in two directions to align each of the exposure sites with the scanning field of the projection assembly 42. Specifically, the stage 50 moves a first one of the wafer exposure sites into the scanning field for performance of the projection/scanning steps and then, upon completion of these steps, moves a second one of the wafer exposure sites into the scanning field. This process is repeated for each of the exposure sites, there being six in the illustrated embodiment (FIG. 5). It should be noted, however, that a scanning system without such a stepping procedure is possible with, and contemplated by, the present invention.

In the illustrated embodiment, the wafer 32 is a test wafer and the reticle 34 is a test reticle. In other words, the wafer 32 and the reticle 34 are not production components, but rather used only to test the lithography system 30 for linewidth accuracies. In this manner, the system 30 may be tested to determine whether, during an actual production run, the linewidths of the pattern created during lithography will be within acceptable tolerances.

As shown in FIG. 4, the test reticle 34 is provided with a pattern having feature sizes corresponding to the desired circuit patterns that will be created in the lithography system 30. The test pattern may be a variety of geometries. For example, the pattern may comprise a series of straight lines 74 extending in either the scan direction x or the slit direction y. In the illustrated embodiment, the lines 74 extend in the slit direction y and have a width corresponding to 1 $\mu$m design features. Also, the lines 74 are separated center to center by a distance corresponding to 3$\mu$m in the desired circuit pattern. Thus, in a 4:1 reduction system, the lines would have, for example, a width is 4 $\mu$m and would separated by 12 $\mu$m.

As shown in FIG. 5, the reticle pattern is transferred to the test wafer 32 thereby delineating a test pattern onto the stepper-aligned exposure site 56 of the wafer 32. The test pattern is a demagnified version of the reticle pattern. As such, the test pattern includes a series of straight lines 84 that extend in the slit direction, have a linewidth of 1 $\mu$m, and are separated by a distance of 3 $\mu$m.

Figure 6:
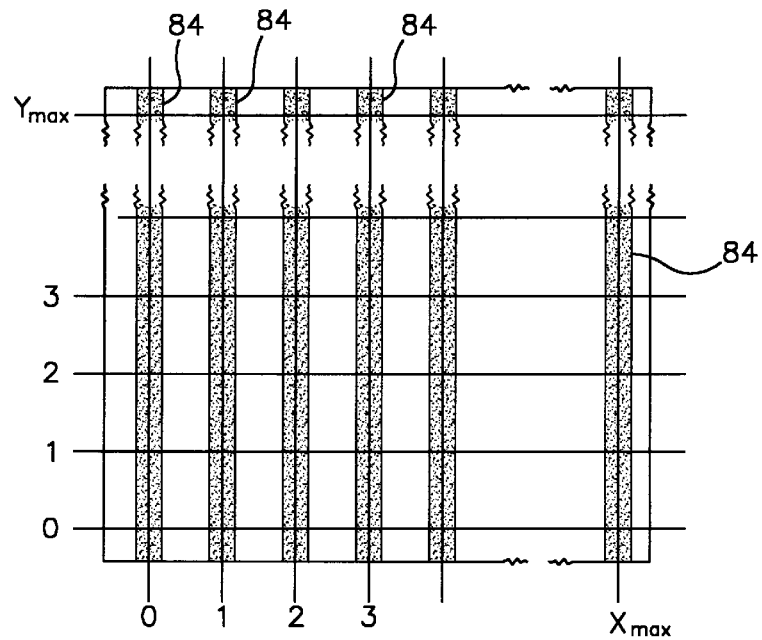
FIG. 6 is a enlarged view of the selected exposure site analytically divided into a plurality of points (x,y).

The wafer exposure site 56 is then analytically divided into a grid as shown in FIG. 6. (For the purposes of the present invention, the term "divided" refers only to a conceptual mapping of the exposure site 84 and not to any type of physical separation or marking.) The grid has one series of lines extending in the scan direction x and another series of lines extending in the slit direction y. The points corresponding to the perpendicular intersections of the lines may each be assigned a pair of coordinates (x,y). In the preferred and illustrated embodiment, the lines are perpendicularly arranged and spaced apart equal distances to create a plurality of equal grid areas. However, other arrangements and/or spacings may be possible depending on the particular pattern and/or scanning technique.

The grid is arranged (and/or the pattern of the test reticle 34 is arranged) so that each point (x,y) is centrally positioned relative to one of the lines 74. In this manner, the width of the line 74 at each point (x,y) may be measured and compared to a target linewidth. (FIGS. 7A–7P.) For example, if the point (0,0) shown in FIG. 7A has a linewidth of 0.88 $\mu$m and the target value is 1 $\mu$m, the linewidth error E(x,y) is equal to $-0.12$ $\mu$m. Similarly, if the point (1,0) shown in FIG. 7B has a linewidth of 1.1 $\mu$m and the target value is 1 $\mu$m, the linewidth error is equal to $+0.1$ $\mu$m.

The linewidth at each point (x,y) is measured and compared to the target value to provide a two dimensional array E(x,y) for each value of x from 0 to $X_{max}$ and for each value of y from 0 to $Y_{max}$:

$$\begin{array}{ccccc} E(0, Y_{\max}) & E(1, Y_{\max}) & E(2, Y_{\max}) & \ldots & E(X_{\max}, Y_{\max}) \\ \vdots & \vdots & \vdots & & \vdots \\ E(0, 2) & E(1, 2) & E(2, 2) & \ldots & E(X_{\max}, 2) \\ E(0, 1) & E(1, 1) & E(2, 1) & \ldots & E(X_{\max}, 1) \\ E(0, 0) & E(1, 0) & E(2, 0) & \ldots & E(X_{\max}, 0) \end{array}$$

$$E_{average} = \frac{\sum E(x_i, y_j)}{(X_{\max} + 1) \cdot (Y_{\max} + 1)}$$

$$\begin{array}{ccccc} ERROR(0, Y_{\max}) & ERROR(1, Y_{\max}) & ERROR(2, Y_{\max}) & & ERROR(X_{\max}, Y_{\max}) \\ \vdots & \vdots & \vdots & & \vdots \\ ERROR(0, 2) & ERROR(1, 2) & ERROR(2, 2) & \ldots & ERROR(X_{\max}, 2) \\ ERROR(0, 1) & ERROR(1, 1) & ERROR(2, 1) & \ldots & ERROR(X_{\max}, 1) \\ ERROR(0, 0) & ERROR(1, 0) & ERROR(2, 0) & \ldots & ERROR(X_{\max}, 0) \end{array}$$

wherein $ERROR(x,y) = E(x,y) - E_{average}$

The ERROR (x,y) values are then grouped into a series of one-dimensional arrays by common y coordinates:

$$Array(Y_{\max})$$
$$\begin{array}{ccccc} ERROR(0, Y_{\max}) & ERROR(1, Y_{\max}) & ERROR(2, Y_{\max}) & \ldots & ERROR(X_{\max}, Y_{\max}) \end{array}$$
$$\vdots \qquad \vdots \qquad \vdots \qquad \qquad \vdots$$
$$Array(Y2)$$
$$\begin{array}{ccccc} ERROR(0, 2) & ERROR(1, 2) & ERROR(2, 2) & \ldots & ERROR(X_{\max}, 2) \end{array}$$
$$Array(Y1)$$
$$\begin{array}{ccccc} ERROR(0, 1) & ERROR(1, 1) & ERROR(2, 1) & \ldots & ERROR(X_{\max}, 1) \end{array}$$

$$Array(Y0)$$

$$ERROR(0,0) \quad ERROR(1,0) \quad ERROR(2,0) \quad \ldots \quad ERROR(X_{\max},0)$$

The linewidth errors in each of these arrays is then averaged to calculate the optical aberration contribution $ERROR_{optical}(y)$ to the total linewidth error for each y value:

$$ERROR_{optical} \text{ at } y = Y_{\max} = \frac{\sum ERROR(x_i, Y_{\max})}{(X_{\max}+1)} \quad \text{wherein } i = 0 \text{ to } X_{\max}$$

$$\vdots$$

$$ERROR_{optical} \text{ at } y = 2 = \frac{\sum ERROR(x_i, 2)}{(X_{\max}+1)} \quad \text{wherein } i = 0 \text{ to } X_{\max}$$

$$ERROR_{optical} \text{ at } y = 1 = \frac{\sum ERROR(x_i, 1)}{(X_{\max}+1)} \quad \text{wherein } i = 0 \text{ to } X_{\max}$$

$$ERROR_{optical} \text{ at } y = 0 = \frac{\sum ERROR(x_i, 0)}{(X_{\max}+1)} \quad \text{wherein } i = 0 \text{ to } X_{\max}$$

Based on the $ERROR_{optical}$ value for each y coordinate, the contribution of non-optical factors to the linewidth errors may be determined by subtracting the optical contribution from the total linewidth error. This provides a two-dimensional array $ERROR_{other}(x,y)$ for each value of x from 0 to $X_{max}$ and for each value of y from 0 to $Y_{max}$:

$$ERROR_{other}(0, Y_{\max}) \quad ERROR_{other}(1, Y_{\max}) \quad ERROR_{other}(2, Y_{\max}) \quad ERROR_{other}(X_{\max}, Y_{\max})$$
$$\vdots \qquad \vdots \qquad \vdots \qquad \vdots$$
$$ERROR_{other}(0,2) \quad ERROR_{other}(1,2) \quad ERROR_{other}(2,2) \quad \ldots \quad ERROR_{other}(X_{\max},2)$$
$$ERROR_{other}(0,1) \quad ERROR_{other}(1,1) \quad ERROR_{other}(2,1) \quad \ldots \quad ERROR_{other}(X_{\max},1)$$
$$ERROR_{other}(0,0) \quad ERROR_{other}(1,0) \quad ERROR_{other}(2,0) \quad \ldots \quad ERROR_{other}(X_{\max},0)$$

wherein $ERROR_{other}(x,y) = E(x,y) - ERROR_{optical}(y)$

The $ERROR_{other}(x,y)$ values are indicative of the non-optical contributions to the linewidth errors in the lithography system 30. For example, because of the physics of scanning, all geometries located in the same x position will be affected by scanning errors in the same way. To this end, the $ERROR_{other}(x,y)$ values are grouped into a series of one-dimensional arrays by common x coordinates:

$$Array(X_{\max})$$

$$ERROR_{other}(X_{\max},0) \quad ERROR_{other}(X_{\max},1) \quad ERROR_{other}(X_{\max},2) \quad \ldots \quad ERROR_{other}(X_{\max},Y_{\max})$$
$$\vdots \qquad \vdots \qquad \vdots \qquad \vdots$$

$$Array(X2)$$

$$ERROR_{other}(2,0) \quad ERROR_{other}(2,1) \quad ERROR_{other}(2,3) \quad \ldots \quad ERROR_{other}(2,Y_{\max})$$

$$Array(X1)$$

$$ERROR_{other}(1,0) \quad ERROR_{other}(1,1) \quad ERROR_{other}(1,3) \quad \ldots \quad ERROR_{other}(1,Y_{\max})$$

$$Array(X0)$$

$$ERROR_{other}(0,0) \quad ERROR_{other}(0,1) \quad ERROR_{other}(0,2) \quad \ldots \quad ERROR_{other}(0,Y_{\max})$$

The $ERROR_{other}(x,y)$ values in each of these X groups may then averaged to provide the scanning error factor $ERROR_{scan}$ at each x coordinate:

$$ERROR_{scan} \text{ at } x = X_{max} = \frac{\sum ERROR_{other}(X_{max}, y_j)}{(Y_{max} + 1)} \text{ wherein } j = 0 \text{ to } Y_{max}$$

$$\vdots$$

$$ERROR_{scan} \text{ at } x = 2 = \frac{\sum ERROR_{other}(2, y_j)}{(Y_{max} + 1)} \text{ wherein } j = 0 \text{ to } Y_{max}$$

$$ERROR_{scan} \text{ at } x = 1 = \frac{\sum ERROR_{other}(1, y_j)}{(X_{max} + 1)} \text{ wherein } j = 0 \text{ to } Y_{max}$$

$$ERROR_{scan} \text{ at } x = 0 = \frac{\sum ERROR_{other}(0, y_j)}{(Y_{max} + 1)} \text{ wherein } j = 0 \text{ to } Y_{max}$$

In this manner, for each point(x,y) an $ERROR_{optical}(y)$ value and an $ERROR_{scan}(x)$ value may be assigned.

Accordingly, the present invention provides a method of characterizing linewidth errors. More particularly, the present invention provides a method of separating the contribution of optical aberrations to linewidth errors from the contributions caused by other components of the lithography system 30.

It should be noted that although the system and method have been described as using a test reticle and/or test wafer, actual desired circuit patterns may be used as well. Also, the method need not be used only for calibration purposes, but could be practiced at any point during a lithography process. Furthermore, although the invention has been shown and described with respect to the preferred embodiment, it is apparent that certain alterations and modifications will occur to others skilled in the art upon a reading and understanding of this specification. The present invention includes all such alterations and modifications and is limited only by the following claims.

We claim:

1. A method of characterizing linewidth errors in a lithography system used to delineate a desired pattern onto an exposure site of a wafer, said method comprising the steps of:

providing a reticle having a pattern;

delineating the pattern onto an exposure site of a wafer by projecting a slit of light extending in a slit direction y through the reticle while scanning the reticle and the wafer in a scanning direction x relative to the lens;

conceptually dividing the exposure site into a grid having one series of lines extending in the scan direction x and another series of lines extending in the slit direction y whereby points corresponding to intersections of the lines may each be assigned a pair of coordinates (x,y);

measuring linewidths of the portion of the pattern at each of the points (x,y);

generating a linewidth error value ERROR (x,y) for each of the points (x,y);

calculating an $ERROR_{optical}(y)$ value for each y coordinate by averaging the ERROR (x,y) values for each group of points (x,y) having a common y coordinate to determine the contribution of optical aberrations to linewidth errors.

2. A method as set forth in claim 1 wherein the series of lines extending in the scan direction x are substantially parallel to each other and the series of lines extending in the slit direction y are substantially parallel to each other.

3. A method as set forth in claim 2 wherein the series of lines extending in the scan direction x are substantially perpendicular to the slit direction y.

4. A method as set forth in claim 1 wherein said generating step comprises:

comparing each of the measured linewidths to a target value to generate a value E(x,y) for each point (x,y);

averaging the values E(x,y) to provide an $E_{average}$ value;

subtracting the $E_{average}$ value from each E(x,y) value to generate the linewidth error values ERROR(x,y).

5. A method as set forth in claim 4 further comprising the steps of generating an $ERROR_{other}$ (x,y) value for each of the points (x,y) by subtracting the corresponding the $ERROR_{optical}(y)$ value from the ERROR(x,y) value.

6. A method as set forth in claim 5 further comprising the step of calculating an $ERROR_{scan}(x)$ value for each x coordinate by averaging the $ERROR_{other}(xy)$ values for each group of points (x,y) having a common x coordinate to determine the contribution of scanning errors to linewidth errors.

7. A method as set forth in claim 6 wherein said reticle-providing step comprises providing a test reticle designed so that a feature of the pattern will be substantially centrally positioned within at least a majority of the plurality of the points (x,y).

8. A method as set forth in claim 7 wherein the pattern comprises a series of lines extending in either the scan direction x or the slit direction y.

9. A method as set forth in claim 8 wherein the lines have a width corresponding to 1 µm design features.

10. A method as set forth in claim 8 wherein the series of lines extend in the slit direction y.

11. A method as set forth in claim 10 wherein the lines have a width corresponding to 1 µm design features.

12. A method as set forth in claim 1 wherein said reticle-providing step comprises providing a test reticle designed so that a feature of the pattern will be substantially centrally positioned within at least a majority of the plurality of the points (x,y).

13. A method as set forth in claim 12 wherein the pattern comprises a series of lines extending in either the scan direction x or the slit direction y.

14. A method as set forth in claim 13 wherein the lines have a width corresponding to 1 µm or less design features.

15. A method as set forth in claim 13 wherein the series of lines extend in the slit direction y.

16. A method as set forth in claim 15 wherein the lines have a width corresponding to 1 µm or less design features.

17. A method as set forth in claim 1 wherein said delineating step comprises using reduction optics whereby the pattern on the reticle is an enlarged version of the pattern delineated onto the wafer and whereby the reticle is scanned at a faster rate than the wafer.

18. A method as set forth in claim 16 wherein the reduction optics introduces a 4:1 demagnification factor and the reticle is scanned at a rate four times faster than the wafer.

19. A method as set forth in claim 17 wherein said delineating step comprises using reflective optics whereby the slit of light is in the form of an arcuate ring concentric with a reflective axis.

20. A method as set forth in claim 1 wherein said delineating step comprises using reflective optics whereby the slit of light is in the form of an arcuate ring concentric with a reflective axis.

* * * * *